United States Patent
Butzmann

(10) Patent No.: US 7,443,161 B2
(45) Date of Patent: Oct. 28, 2008

(54) METHOD OF DETERMINING ANGLES

(76) Inventor: Stefan Butzmann, Hesterstr. 4, 58135 Hagen (DE)

( * ) Notice: Subject to any disclaimer, the term of this patent is extended or adjusted under 35 U.S.C. 154(b) by 41 days.

(21) Appl. No.: 10/585,060

(22) PCT Filed: Dec. 23, 2004

(86) PCT No.: PCT/IB2004/052911

§ 371 (c)(1),
(2), (4) Date: Apr. 24, 2007

(87) PCT Pub. No.: WO2005/078466

PCT Pub. Date: Aug. 25, 2005

(65) Prior Publication Data

US 2007/0273372 A1  Nov. 29, 2007

(30) Foreign Application Priority Data

Jan. 7, 2004  (EP) .................. 04100020

(51) Int. Cl.
*G01R 33/09* (2006.01)
*G01B 7/30* (2006.01)

(52) U.S. Cl. ............. 324/252; 324/207.11; 324/207.21; 324/207.25

(58) Field of Classification Search ........... 324/207.11, 324/207.13, 207.18–207.19, 207.21, 207.25, 324/249, 252; 73/514.31, 514.39; 365/158; 338/32 R, 32 H See application file for complete search history.

(56) References Cited

U.S. PATENT DOCUMENTS 6,104,187 A * 8/2000 Marx et al. ............. 324/207.21
6,943,544 B2 * 9/2005 Waffenschmidt ....... 324/207.21

* cited by examiner

*Primary Examiner*—Bot LeDynh
(74) *Attorney, Agent, or Firm*—Peter Zawilski

(57) ABSTRACT

In order to provide a method of determining an angle a of an external magnetic field relative to a magnetoresistive angle sensor with two full bridges which respectively supply an output signal $U_1=U_0\sin(2\alpha)$, $U_2=U_0\cos(2\alpha)$, wherein the angle determination can be carried out using simple electronic components, it is proposed that the angle $\alpha$ is determined in an analog manner using the relation $\alpha=\frac{1}{2}*(U_1/(|U_1|+|U_2|))-1*sgn(U_2)$.

9 Claims, 2 Drawing Sheets

METHOD OF DETERMINING ANGLES

This is a 371 national phase application of PCT/IB04/052911 filed 23 Dec. 2004, which claims priority to EPO Patent Application No. 04100020.9 filed 7 Jan. 2004, the contents of which are incorporated herein by reference in its entirety.

The invention relates to a method of determining an angle $\alpha$ of an external magnetic field relative to a magnetoresistive angle sensor with two full bridges which respectively supply an output signal $U_1 = U_0 \sin(2\alpha)$, $U_2 = U_0 \cos(2\alpha)$.

Magnetoresistive sensors are usually used to detect angles in motor vehicle technology in order, inter alia, to monitor and control the position of a pedal or the position of a throttle. In this case, the magnetoresistive angle sensor usually consists of two full bridges which are offset by 45° with respect to one another, said bridges being exposed to an external magnetic field. The two full bridges supply, as a function of an angle of the external magnetic field relative to a reference axis of the sensor, voltage output signals which can be shown in a manner known to the person skilled in the art using the following relation:

$$U_1 = U_0 \sin(2\alpha)$$

$$U_2 = U_0 \cos(2\alpha)$$

Here, $U_1$ and $U_2$ are the voltage output signals of the two full bridges, $U_0$ is the voltage amplitude of the output signal, which depends inter alia on the ambient temperature, and cc is the angle of the external magnetic field relative to a reference axis of the sensor.

The angle $\alpha$ of the external magnetic field relative to the sensor or relative to the magnetoresistive bridges is determined from these output signals, for example using the CORDIC algorithm. In order to implement this algorithm, the analog output signals must be converted into digital signals by means of an analog/digital converter.

The angle $\alpha$ of the external magnetic field relative to the sensor is then determined using the likewise known relation:

$$\alpha = \tfrac{1}{2} * \arctan(U_1/U_2) = \tfrac{1}{2} * \arctan(\sin(2\alpha)/\cos(2\alpha))$$

for example using digital signal processing means suitable for this purpose. Taking account of the sign of the output voltage $U_2$, the angle $\alpha$ can be calculated with extremely high accuracy using the arctan function over 180°.

A disadvantage of the known sensors and of the signal processing methods used to date is that there is a risk that the signals will become noisy on account of the analog/digital conversion and the signals will be falsified on account of unintentionally occurring offset voltages. These offset voltages may be caused for example by incorrect etching of a resistor of a Wheatstone bridge. Moreover, the conversion into digital pulses requires considerable signal processing time. Furthermore, the digital signal processing means are expensive in terms of initial cost and are liable to faults. For many applications, particularly in motor vehicle technology, the accuracy which can be achieved with such a CORDIC algorithm is much higher than is actually necessary. Likewise, in motor vehicle technology, there is a desire for economic reasons to use sensors that are considerably more cost-effective and do not operate in such a precise manner but which nevertheless have sufficient measurement accuracy.

It is an object of the invention to specify a method of determining an angle using magnetoresistive sensors, which method can be carried out in a simple manner and in which the angle can be reliably determined when determining the angle a of the external magnetic field relative to a sensor.

The core concept of the invention is that the arctan function of the above-described CORDIC algorithm can be approximated with sufficient accuracy by the mathematical relation given in Equation 1.

$$\alpha = \tfrac{1}{2} * ((U1/(|U1|+|U2|)) - 1 * \mathrm{sgn}(U2)) \tag{1}$$

In this case, the output signals $U_i$ of the two full bridges are subjected to simple mathematical operations such as addition, subtraction, multiplication and division, which require only analog processing of the output signals. It is thus possible, using analog means, to determine with sufficient accuracy the angle $\alpha$ for a wide range of applications. Here, the function sgn(U2) is the sign function known per se. This means that the function assumes the value "−1" for an output signal U2<0, the function assumes the value "+1" for an output signal U2<0 and the function assumes the value "0" for the value U20=0.

The advantage of the invention consists in that the method of determining angles can be implemented using simple electronic components known to the person skilled in the art, without it being necessary to carry out analog/digital conversion beforehand. The determination of the angle $\alpha$ is thus accelerated and reliably ensured, and the cost is considerably reduced since no expensive electronic components that are liable to faults are required for digital signal processing or signal calculation.

Advantageous developments of the invention are characterized in the dependent claims.

In an example embodiment, by virtue of the use of anisotropic magneto resistive (AMR) bridges exact output signals can be obtained as a function of the angle a of the external magnetic field relative to the sensors or bridges. The arrangement of the bridges in the external magnetic fields is known to the person skilled in the art, as is the reading of the corresponding voltage output signal. Advantageously, the bridges may be so-called Wheatstone bridges which are particularly suitable for use in motor vehicle technology with the loads which occur there. The output signals of these bridges can be fed to analog further processing in a simple manner.

In another example embodiment, the output signals of the bridges are processed only by means of analog elements or electronic components. This means that the output signals of the bridges are processed only by means of electronic components which implement additions/subtractions, etc., as specified by the relation, $\alpha = \tfrac{1}{2} * ((U1/(|U1|+|U2|)) - 1 * \mathrm{sgn}(U2))$ where an external magnetic field is relative to a magneto resistive angle sensor with two full bridges which respectively supply an output signal $U_1 = U_0 \sin(2\alpha)$, $U2 = U_0 \cos(2\alpha)$. Such addition or multiplication elements are known to the person skilled in the art. They offer the advantage that they are cost-effective and are not very liable to faults, so that the determination of the angle $\alpha$ can be carried out in an economic manner with sufficient accuracy using the afore-mentioned relation.

It will be understood that the determination of the angle $\alpha$ of an external magnetic field relative to a magnetoresistive sensor may be used in any technical field. Particularly, preferably, however, For example, the method may be used in motor vehicle technology, in particular to monitor the position of a pedal. The pedal may include the gas pedal or brake pedal and either one or the other or both may be monitored. A position of a throttle for controlling the engine power may also by monitored by the present invention.

The invention will be further described with reference to an example of embodiment shown in the drawings to which, however, the invention is not restricted.

Figure 1:
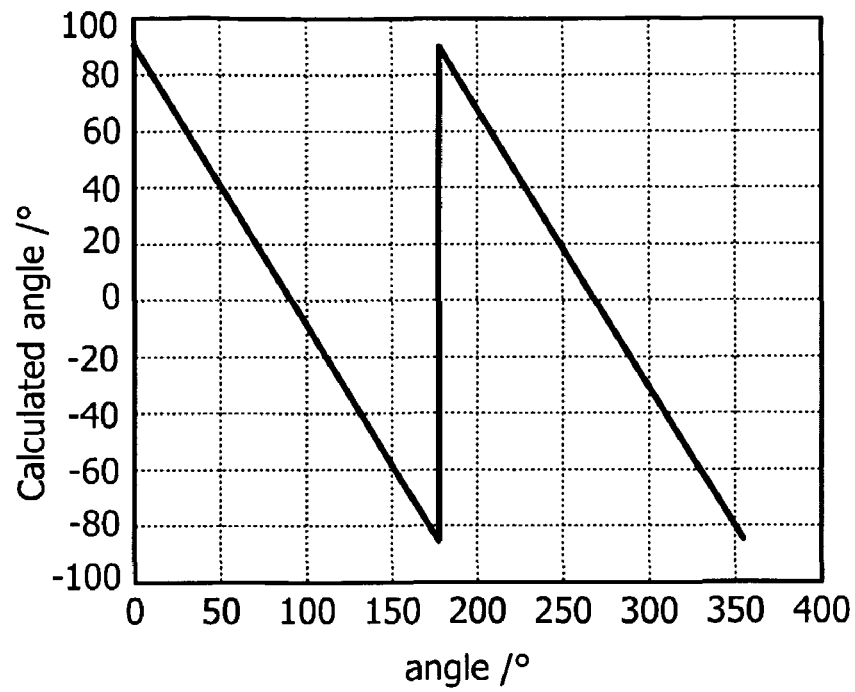
FIG. 1 shows the calculated angle α of an external magnetic field relative to an angle sensor according to the prior art.

The graph in FIG. 1 shows the angle α of an external magnetic field relative to a reference axis in a magnetoresistive angle sensor, said angle having been determined for example in accordance with the CORDIC algorithm. In said graph, the calculated angle α is plotted on the y-axis against the angular range from 0 to 360° on the x-axis.

Figure 2:
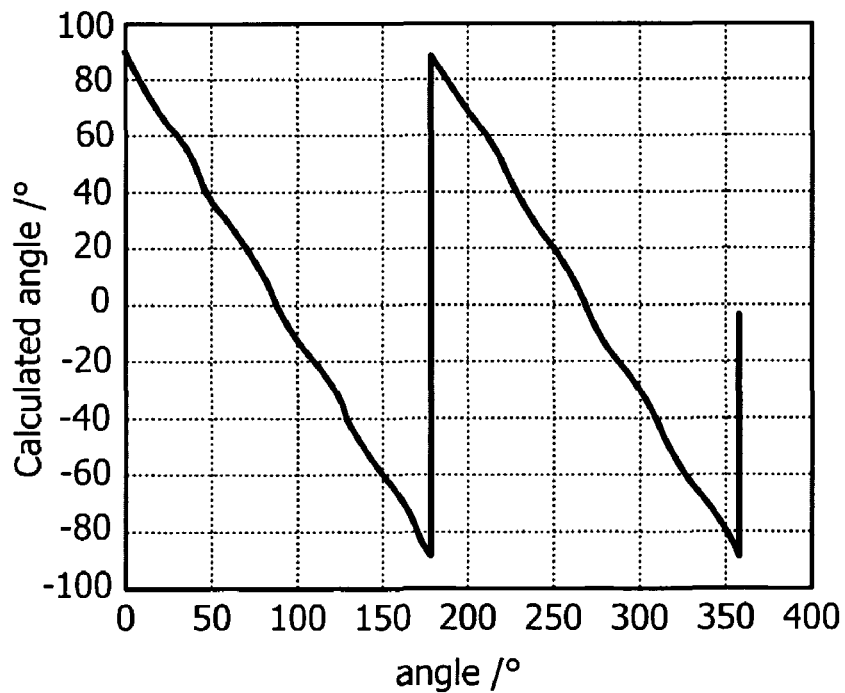
FIG. 2 shows the angle α determined according to the invention.

The graph in FIG. 2 shows the angle α obtained in a purely analog manner by means of the method according to the invention, said angle likewise being plotted against the angular range from 0 to 360°. From this graph it can be seen that the calculated angle α fluctuates about the ideal inclined straight lines which are shown in FIG. 1 and result from the digitally exactly calculated arctan function of the CORDIC algorithm. This means that with this method slight deviations from the actual measured value are obtained, although these lie within the tolerances required in particular in motor vehicle technology so that the simplified method that can be carried out using purely analog electronic components meets the requirements.

Figure 3:
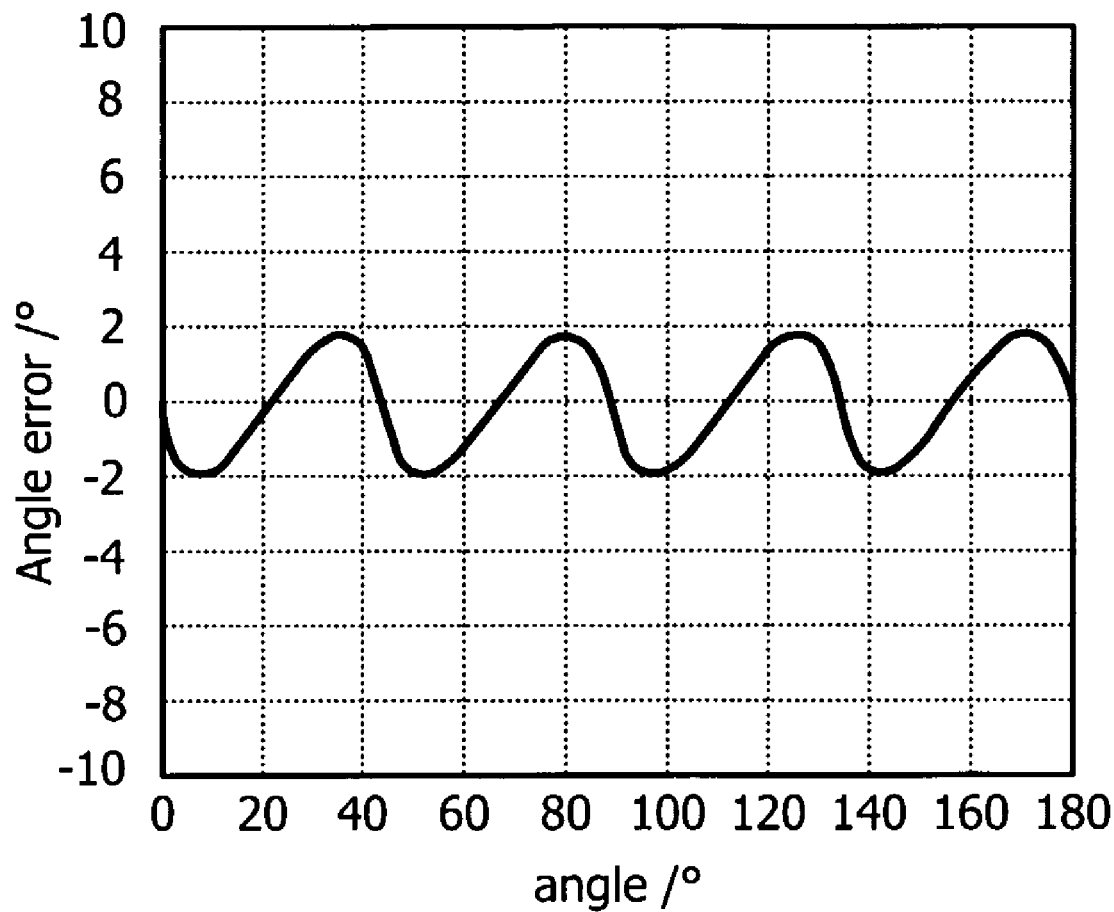
FIG. 3 shows the error in the angle α determined according to the invention.

FIG. 3 shows the difference between the angle determined using the method according to the invention and the actual angle α of the external magnetic field. The angle error, which is shown over a range from 0 to 180°, at no point exceeds the value of +/−2°. It can furthermore be seen that at the values 0°, 45°, 90°, etc., the angle error is even zero, so that these points can be measured with high accuracy using the new method. In the case of a pedal of a motor vehicle, for example, the angle sensor may be arranged such that when the pedal is not pushed down the angle of the external magnetic field relative to the sensor is 0° and an exact measured value is obtained, and when the pedal is fully pushed down for example 90° is measured.

List of References

| | |
|---|---|
| α | angle between an external magnetic field and a sensor |
| U | voltage output signal |
| $U_0$ | voltage amplitude |

The invention claimed is:

1. A method of determining an angle α of an external magnetic field relative to a magneto resistive angle sensor with two full bridges which respectively supply an output signal $U_1=U_0\sin(2\alpha)$, $U_2=U_0\cos(2\alpha)$, characterized in that the angle α is determined in an analog manner using the relation $\alpha=\frac{1}{2}*((U1/(|U1|+|U2|))-1*\text{sgn}(U2)$.

2. The method as recited in claim 1, characterized in that anisotropic magneto resistive (AMR) bridges are used.

3. The method as recited in claim 1, characterized in that output signals of the bridges are processed using analog elements.

4. The use of the method as recited in claim 1 in motor vehicle technology, for monitoring at least one of the following: pedal or throttle.

5. The method as recited in claim 2, characterized in that output signals of the bridges are processed using analog elements.

6. The method as recited in claim 2, characterized in the AMR bridges are Wheatstone bridges.

7. The use of the method as recited in claim 2 in motor vehicle technology, for monitoring at least one of the following: pedal or throttle.

8. The use of the method as recited in claim 3 in motor vehicle technology, for monitoring at least one of the following: pedal or throttle.

9. The method as recited in claim 4, wherein the pedal includes at least one of the following: brake pedal, gas pedal.

\* \* \* \* \*